United States Patent
You et al.

(10) Patent No.: US 9,627,513 B2
(45) Date of Patent: Apr. 18, 2017

(54) METHOD FOR MANUFACTURING LATERAL DOUBLE-DIFFUSED METAL OXIDE SEMICONDUCTOR TRANSISTOR

(71) Applicant: Silergy Semiconductor Technology (Hangzhou) Ltd., Hangzhou (CN)

(72) Inventors: Budong You, Hangzhou (CN); Meng Wang, Hangzhou (CN); Zheng Lyu, Hangzhou (CN)

(73) Assignee: Silergy Semiconductor Technology (Hangzhou) Ltd., Hangzhou (CN)

(*) Notice: Subject to any disclaimer, the term of this patent is extended or adjusted under 35 U.S.C. 154(b) by 0 days.

(21) Appl. No.: 14/862,453

(22) Filed: Sep. 23, 2015

(65) Prior Publication Data
US 2016/0087081 A1    Mar. 24, 2016

(30) Foreign Application Priority Data
Sep. 23, 2014    (CN) .......................... 2014 1 0489590

(51) Int. Cl.
*H01L 21/336* (2006.01)
*H01L 29/66* (2006.01)
*H01L 29/78* (2006.01)
*H01L 29/08* (2006.01)
(Continued)

(52) U.S. Cl.
CPC .. *H01L 29/66681* (2013.01); *H01L 29/66689* (2013.01); *H01L 29/7816* (2013.01); *H01L 29/0653* (2013.01); *H01L 29/0878* (2013.01); *H01L 29/42368* (2013.01)

(58) Field of Classification Search
CPC ......... H01L 29/66681; H01L 29/66689; H01L 29/7816–29/7826
See application file for complete search history.

(56) References Cited

U.S. PATENT DOCUMENTS 8,598,000 B2 * 12/2013 Zuniga ............ H01L 21/823418
257/315
2010/0102388 A1 * 4/2010 Levin .............. H01L 21/823418
257/343

FOREIGN PATENT DOCUMENTS

| CN | 101034671 A | 9/2007 |
| CN | 101656215 A | 2/2010 |
| CN | 101819937 A | 9/2010 |

* cited by examiner

*Primary Examiner* — Daniel Shook
(74) *Attorney, Agent, or Firm* — Westman, Champlin & Koehler, P.A.

(57) ABSTRACT

The present disclosure relates to a lateral double-diffused metal oxide semiconductor transistor and a method for manufacturing the same. In the method, a high-voltage gate dielectric is formed at a surface of a semiconductor layer. A thin gate dielectric is formed above the substrate and has at least a portion adjacent to the high-voltage gate dielectric. A gate conductor is formed above the thin gate dielectric and the high-voltage gate dielectric. A first mask is used for patterning the gate conductor to define a first sidewall of the gate conductor above the thin gate dielectric. A second mask is used for patterning the gate conductor to define a second sidewall of the gate conductor at least partially above the high-voltage gate dielectric. Source and drain regions are formed to have a first doping type. The method further comprises doping through the first mask to form a body region of a second doping type. The second doping type is opposite to the first doping type. The method simplifies a manufacturer process and improves reliability of the resultant devices.

13 Claims, 10 Drawing Sheets

(51) Int. Cl.
*H01L 29/423* (2006.01)
*H01L 29/06* (2006.01)

METHOD FOR MANUFACTURING LATERAL DOUBLE-DIFFUSED METAL OXIDE SEMICONDUCTOR TRANSISTOR

CLAIM OF PRIORITY

This application claims priority to Chinese Application No. 201410489590.9, filed on Sep. 23, 2014 (published as CN 104241384 A), which is hereby incorporated by reference.

BACKGROUND OF THE DISCLOSURE

Field of the Disclosure

The present disclosure generally relates to semiconductor devices, and more particularly, to a lateral double-diffused metal oxide semiconductor transistor and a method for manufacturing the same.

Description of the Related Art

In various electronic systems, voltage regulators, such as DC-DC power converters, are used for providing a stable supply voltage. A high-efficient DC-DC power converter is a critical factor in battery management in a low-power apparatus such as a notebook, a mobile phone and the like. A switching regulator converts a DC voltage to a high-frequency pulse voltage and then filters it to generate a DC output voltage. Specifically, the switching regulator includes a power switch for coupling a DC voltage source such as a battery to a load such as an integrated circuit and decoupling the DC voltage source from the load repeatedly. An output filter typically includes an inductor and a capacitor, which are coupled between the input voltage source and the load, for filtering an output signal of the power switch and providing a DC output voltage. A controller, such as a PWM (i.e. pulse width modulation) controller, a PFM (i.e. pulse frequency modulation) controller, or the like, may be used for controlling the power switch to maintain stable DC output voltage.

The power switch may be a semiconductor switch, such as a metal-oxide-semiconductor field effect transistor (MOSFET), an insulated gate bipolar transistor (IGBT), and the like. A lateral double-diffused metal oxide semiconductor (LDMOS) transistor has a source region which is formed in a body region having a doping type opposite to that of the conductivity type of the LDMOS transistor, and a drain region which is formed in a high-resistance drift region having a doping type identical to that of the conductivity type of the LDMOS transistor. Due to the existence of the drift region, the drain region of the LDMOS can withstand a high voltage. Accordingly, the LDMOS transistor can provide advantages of a large driving current, a low on resistance and a high breakdown voltage, and widely be used in the switching regulator.

In a conventional process for manufacturing the LDMOS transistor, both a field oxide FOX and a high-voltage gate oxide HVGOX are formed by local oxidation of silicon, for defining an active region and as a gate dielectric respectively. A gate conductor is used as a hard mask in ion implantation, for forming doped regions in a self-aligned manner. In the self-aligned process, the gate conductor is a hard mask and defines location of the doped regions.

However, the gate conductor has a smaller width and thickness when the power switch is scaled down. If the gate conductor has a small thickness, implanted ions may penetrate the gate conductor into the semiconductor substrate. The gate conductor may be insufficient to be used as a mask layer during ion implantation, and thus fails to define location of the doped regions.

Moreover, the field oxide cannot be scaled down due to so-called "bird beak" phenomenon. With scaling down of the power switch, the field oxide still occupies a field region which has an increased ratio in an area of the active region, and becomes a critical factor which impedes size reduction of the power switch. The field oxide also introduces a step at a surface. In a case that the gate conductor is too thin to have a uniform thickness, the gate conductor cannot be easily patterned during patterning. Thus, a conventional process for forming a LDMOS transistor having a thin gate conductor has disadvantages of poor yield and reliability.

BRIEF DESCRIPTION OF THE DISCLOSURE

In view of this, the present disclosure provides a lateral double-diffused metal oxide semiconductor (LDMOS) transistor and a method for manufacturing the same which expand a process window and improve product reliability.

In one embodiment, there is provided a method for manufacturing a lateral double-diffused metal oxide semiconductor transistor, comprising: forming a semiconductor layer of a first doping type; forming a high-voltage gate dielectric at a surface of the semiconductor layer; forming a thin gate dielectric above the semiconductor layer to have at least a portion adjacent to the high-voltage gate dielectric; forming a gate conduct above the thin gate dielectric and the high-voltage gate dielectric; forming a first sidewall of the gate conductor above the thin gate dielectric, by patterning the gate conductor through a first mask; forming a second sidewall of the gate conductor at least partially above the high-voltage gate dielectric, by patterning the gate conductor through a second mask; and forming source and drain regions of the first doping type, wherein the method further comprises forming a body region of a second doping type opposite to the first doping type by doping through the first mask.

Preferably, the step of forming the second sidewall of the gate conductor is performed before or after the step of forming the first sidewall of the gate conductor.

Preferably, after the step of forming the body region of the second doping type, the method further comprises: forming a source link region by doping though the first mask with a dopant of a first type.

Preferably, the step of forming the semiconductor of the first doping type comprises forming a deep well region of the first doping type by doping a semiconductor substrate, as the semiconductor layer.

Preferably, the step of forming the semiconductor layer of the first doping type comprises: epitaxially growing a semiconductor layer on a semiconductor substrate; and doping the semiconductor layer with a dopant of a first type.

Preferably, before the step of forming the semiconductor layer, or between the step of forming the semiconductor layer and the step of forming the high-voltage gate dielectric, the method further comprises forming shallow trench isolation for defining an active region.

Preferably, between the step of forming the and the step of forming the high-voltage gate dielectric, the method further comprises forming a field oxide for defining an active region.

Preferably, the high-voltage gate dielectric is formed by local oxidation of silicon.

Preferably, the high-voltage gate dielectric extends beyond an edge of the gate conductor near the drain region.

Preferably, after the steps of forming the thin gate dielectric, the high-voltage gate dielectric and the gate conductor as a stack, the method further comprises forming sidewall spacers at the sidewalls of the gate conductor.

Preferably, after the step of the source and drain regions, the method further comprises forming a body contact region of the second doping type and adjacent to the source region.

Preferably, the body contact region is heavily doped compared with the body region.

Preferably, the method further comprises forming a drift region of the first doping type and adjacent to the high-voltage gate dielectric, wherein the source and drain regions are heavily doped compared with the drift region.

Preferably, each of the thin gate dielectric and the high-voltage gate dielectric is made of at least one selected from a group consisting of oxides, nitrides, and high-K dielectrics.

In another embodiment, there is provided a lateral double-diffused metal oxide semiconductor transistor manufactured by the above method, comprising: a semiconductor layer of a first doping type; a body region of a second doping type and a drift region of the first doping type which are formed in the semiconductor layer and are separated from each other, wherein the second doping type is opposite to the first doping type; a source region of the first doping type in the body region; a drain region of the first doping type in the drift region; a thin gate dielectric and a high-voltage gate dielectric between the source and drain regions, wherein the thin gate dielectric is adjacent to the source region and the high-voltage gate dielectric is adjacent to the drain region; and a gate conductor on the thin gate dielectric and on the high-voltage gate dielectric.

Preferably, the lateral double-diffused metal oxide semiconductor transistor further comprises shallow trench isolations for defining an active region.

Preferably, the semiconductor layer is one selected from a group consisting of a deep well region in a semiconductor substrate and a doped semiconductor layer on a semiconductor substrate.

Preferably, the high-voltage gate dielectric extends beyond an edge of the gate conductor near the drain region.

Preferably, the lateral double-diffused metal oxide semiconductor transistor further comprises a body contact region of the second doping type in the body region and adjacent to the source region.

Preferably, the body contact region is heavily doped compared with the body region.

Preferably, the source and drain regions are heavily doped compared with the drift region.

Preferably, each of the thin gate dielectric and the high-voltage gate dielectric is made of at least one selected from a group consisting of oxides, nitrides, and high-K dielectrics.

In the method for manufacturing the semiconductor device according to the above embodiments, the gate conductor is formed by two photolithographic processes after forming an oxide layer and a conductor layer. In one lithographical process, the mask is used both for defining the first side wall of the gate conductor and for forming the body region, so that the gate conductor is aligned to the body region. The process window of doping will be maintained to be a predetermined value, which simplifies the manufacture process and ensures reliability of the resultant devices.

In a preferable embodiment, the shallow trench isolation is used instead of the field oxide to have a smaller size of the field region, and thus to have smaller size of the semiconductor device. Moreover, the semiconductor structure has a flat surface to form a thin gate dielectric with a uniform thickness and good quality. Thus, the semiconductor device has increased yield and improved reliability. In a further preferable embodiment, the shallow trench isolation is formed before formation of the semiconductor layer. Thus, the present process is compatible with a conventional CMOS process.

BRIEF DESCRIPTION OF THE DRAWINGS

The above and other objects, advantages and features of the present invention will become more fully understood from the detailed description given hereinbelow in connection with the appended drawings, and wherein.

DETAILED DESCRIPTION OF EMBODIMENTS OF THE DISCLOSURE

Figure 1A:
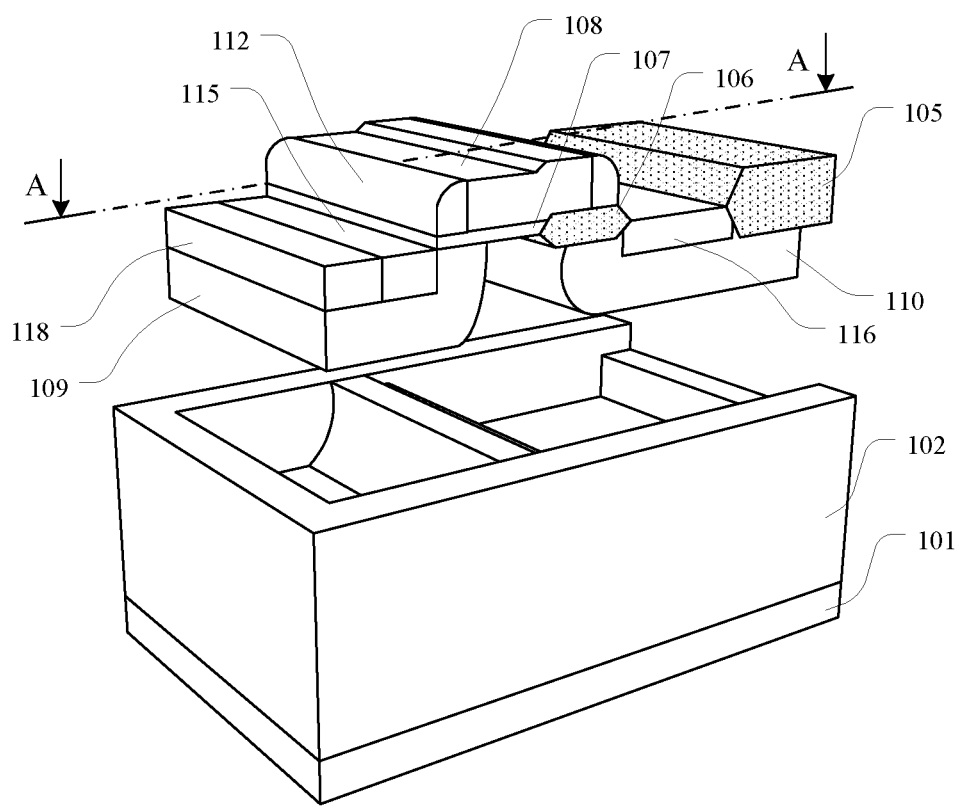
FIGS. 1a and 1b are a perspective view and a cross sectional view of a LDMOS transistor according to the prior art, respectively.

Exemplary embodiments of the present disclosure will be described in more details below with reference to the accompanying drawings. In the drawings, like reference numerals denote like members. The figures are not drawn to scale, for the sake of clarity. Moreover, some well-known parts may not be shown. For simplicity, the structure of the semiconductor device having been subject to several relevant process steps may be shown in one figure.

It should be understood that when one layer or region is referred to as being "above" or "on" another layer or region in the description of device structure, it can be directly above or on the other layer or region, or other layers or regions may be intervened therebetween. Moreover, if the device in the figures is turned over, the layer or region will be "under" or "below" the other layer or region.

In contrast, when one layer is referred to as being "directly on" or "on and adjacent to" or "adjoin" another layer or region, there are not intervening layers or regions present. In the present application, when one region is referred to as being "directly in", it can be directly in another region and adjoins another region, but not in a doping region of another region.

In the present application, the term "semiconductor structure" means generally the whole semiconductor structure formed at each step of the method for manufacturing the semiconductor device, including all of the layers and regions having been formed. Some particular details of the present disclosure will be described below, such as exemplary semiconductor structures, materials, dimensions, process steps and technologies of the semiconductor device, for better understanding of the present disclosure. However, it can be understood by one skilled person in the art that these details are not always essential for but can be varied in a specific implementation of the disclosure.

Figure 1B:
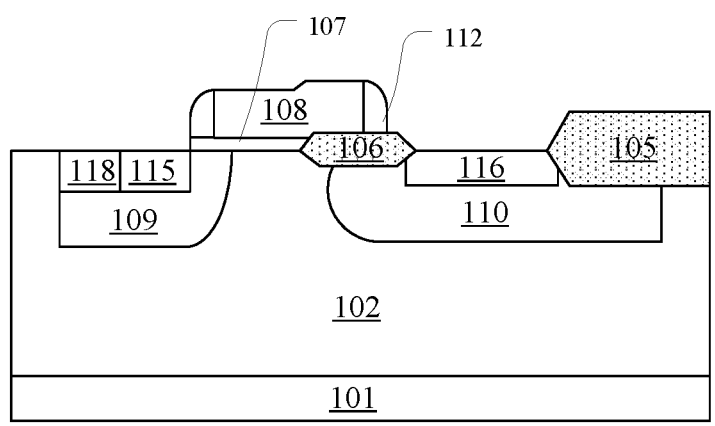

FIGS. 1a and 1b are a perspective view and a cross sectional view of a LDMOS transistor according to the prior art, respectively. In FIG. 1, some parts of the LDMOS transistor are shown as being separated from a semiconductor substrate, only for the sake of clarity. The cross sectional view in FIG. 1b is taken along line AA in FIG. 1a.

As shown in FIGS. 1a and 1b, the LDMOS transistor includes a field oxide 105 for defining an active region. The LDMOS transistor further includes a deep well region 102 of a first doping type in a semiconductor substrate 101; a body region 109 of a second doping type and a drift region 110 of the first doping type, which are formed in the deep well region 102 and separated from each other; a source region 115 of the first doping type and a body contact region 118 of the second doping type, which are formed in the body region 109 and adjacent to each other; a drain region 116 of the first doping type in the drift region 110; a thin gate oxide 107 and a high-voltage gate oxide 106 between the source region 115 and the drain region 116 of the LDMOS transistor, wherein the thin gate oxide 107 is adjacent to the source region 115, and the high-voltage gate oxide 106 is adjacent to the drain region 116; and a gate conductor 108 on the thin gate oxide 107 and the high-voltage gate oxide 106. The high-voltage gate oxide 106 extends beyond an edge of the gate conductor 108 near the drain region 116. Compared with the body region 109, the body contact region 118 is of the same doping type but has a higher doping concentration. Moreover, compared with the drift region 110, the source region 115 and the drain region 116 are of the same doping type but have higher doping concentrations. The first doping type is opposite to the second doping type. For example, the first doping type is an N type, and the second doping type is a P type, or vice versa.

The field oxide 105 formed by a LOCOS process has a thickness in a range between about 4000 angstroms and about 5000 angstroms. The high-voltage gate oxide 106 formed by the LOCOS process has a thickness in a range between about 250 angstroms to about 1500 angstroms. The thin gate oxide 107 formed by a thermal oxidation process has a thickness in a range between about 100 angstroms and about 300 angstroms. In the LOCOS process, the field oxide 105 grows laterally below a nitride mask due to lateral diffusion of oxygen atoms. The resultant oxide layer has a thickness larger than the consumed silicon layer. Meanwhile, the field oxide 105 has a surface raised above a surface of the semiconductor substrate. The field oxide 105 has a cross section with a shape similar to a "bird beak". The field oxide 105 is a critical factor which impedes size reduction of a power switch and causes that a gate conductor to be formed has an uneven thickness. Etching of the gate conductor will be difficult and reliability of the semiconductor device will be poor.

Figure 2A:
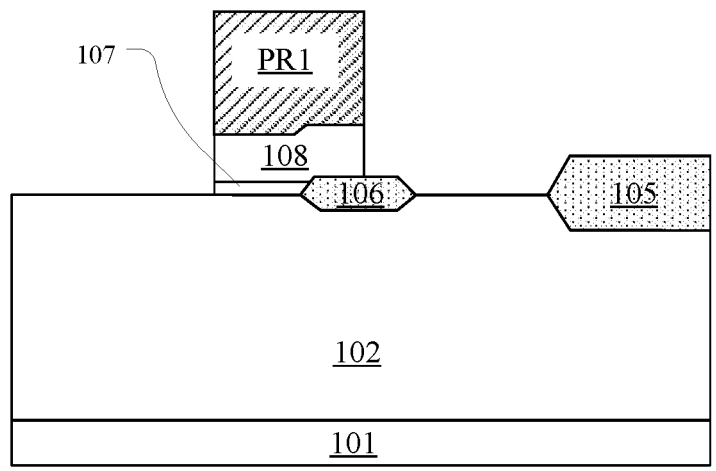
FIGS. 2a to 2b are cross sectional views illustrating some steps of a method for manufacturing a LDMOS transistor according to the prior art.
Figure 2B:
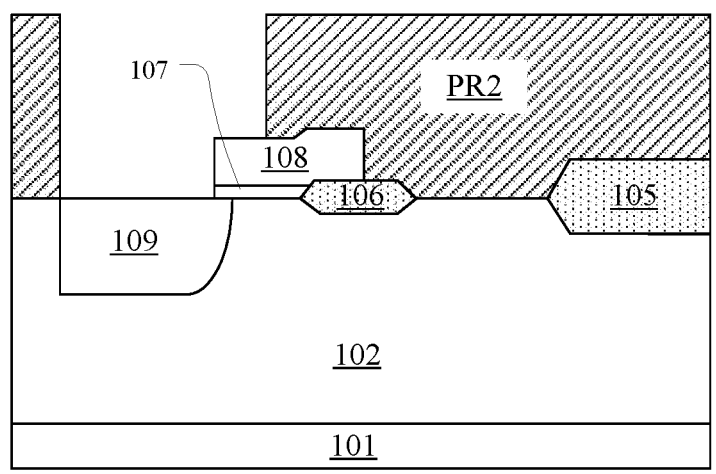

FIGS. 2a to 2b are cross sectional views illustrating some steps of a method for manufacturing a LDMOS transistor according to the prior art. In the step shown in FIG. 2a, a deep well region 102 has been formed in a semiconductor substrate 101, and a field oxide 105 and a high-voltage gate oxide 106 are formed on the deep well region 102. Further, after formation of a thin oxide layer and a conductor layer, the oxide layer and the conductor layer are patterned by etching through a photoresist mask PR1 to form a thin gate oxide 107 and a gate conductor 108.

The photoresist mask PR1 is then removed, and another photoresist mask PR2 is formed on a surface of the semiconductor structure. The deep well region 102 is doped by ion implantation through the photoresist mask PR2 to form a body region 109.

Although ideally the photoresist mask PR2 should be aligned to the thin gate oxide 107 and the gate conductor 108, and should be an effective mask during ion implantation, such an alignment is difficult. Or even worse, the photoresist mask PR2 extends beyond a side wall of the gate conductor 108. Consequently, a portion of the deep well region 102 near the gate conductor 108 will have no implanted dopant.

It has been found that the gate conductor 108 can be used as a hard mask to form the body region 109, if the gate conductor 108 has a relatively large thickness. To this end, the photoresist mask PR2 has an opening which exposes the side wall of the gate conductor 108. During ion implantation, at least a portion of the body region 109 that is adjacent to the gate conductor 108 is self-aligned to the gate conductor 108. However, if the gate conductor 108 has a small thickness, implanted ions may penetrate the gate conductor 108 into the deep well region 102. Consequently, the body region 109 cannot be well defined.

Figure 3A:
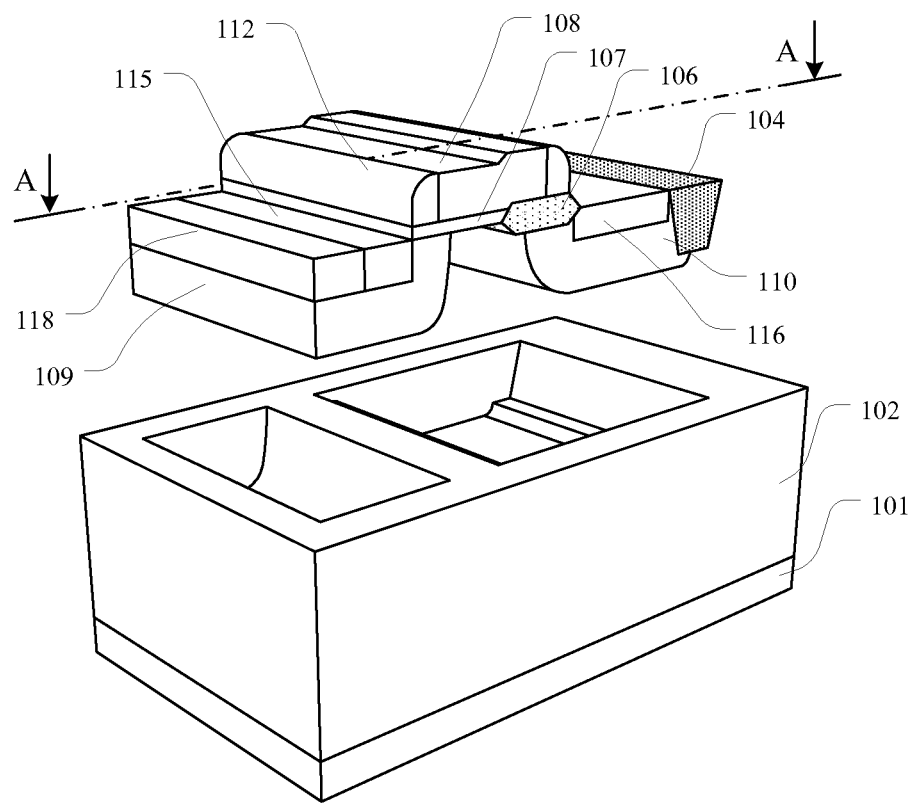
FIGS. 3a and 3b are a perspective view and a cross sectional view of a LDMOS transistor according to an embodiment of the present disclosure, respectively.
Figure 3B:
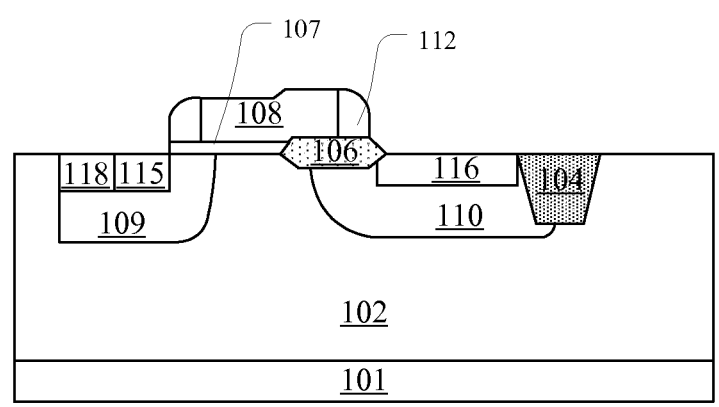

FIGS. 3a and 3b are a perspective view and a cross sectional view of a LDMOS transistor according to an embodiment of the present disclosure, respectively. In FIG. 3a, some parts of the LDMOS transistor are shown as being separated from a semiconductor substrate, only for the sake of clarity. The cross sectional view in FIG. 3b is taken along line AA in FIG. 3a.

The LDMOS transistor according to the present embodiment differs from the conventional LDMOS transistor shown in FIGS. 2a and 2b in that a shallow trench isolation 104 is used for defining an active region, instead of the field oxide 105.

The shallow trench isolation 104 is formed by a process compatible with a conventional CMOS process, for example, by etching and deposition, and optionally is planarized by chemical mechanical polishing so that a gate conductor 108 will be formed to have a uniform thickness. Compared with the field oxide 105, the shallow trench isolation 104 can have a smaller footprint and the power switch can have a reduced size. Moreover, the thin conductor has a uniform thickness and can be easily patterned to form the gate conductor 108 to improve reliability of the resultant device.

Other aspects of the LDMOS transistor according to the present embodiment are the same as the conventional LDMOS transistor shown in FIGS. 2a and 2b.

FIGS. 4a to 4j are cross-sectional views illustrating various steps of a method for manufacturing a LDMOS transistor according to an embodiment of the present disclosure. The cross sectional views in FIGS. 4a to 4j are all taken along line AA in FIG. 3a.

The method according to the present invention starts with a semiconductor substrate 101. Shallow trench isolation 104 is formed in the semiconductor substrate 101 for defining an active region. The process for forming the shallow trench isolation 104 is identical to the conventional CMOS process, and may be formed simultaneously shallow isolation of the CMOS device.

For example, the process for forming the shallow trench isolation 104 includes forming a photoresist layer on the semiconductor substrate 101. A pattern of the shallow trench isolation 104 is formed by a lithographic process to provide openings corresponding to location of the shallow trench isolation 104 in the photoresist layer, to form a photoresist mask (not shown). Then, a portion of the semiconductor substrate 101 is removed by etching from top to bottom through the openings in the photoresist mask, to form a shallow trench in the semiconductor substrate 101. By controlling a time period of etching, the shallow trench in the substrate 101 can reach a predetermined depth to form the shallow trench. Then, an insulating material fills the shallow trench and forms the shallow trench isolation. Optionally, a portion of the insulating material outside the shallow trench is removed by chemical mechanical polishing.

The etching may be dry etching such as ion beam milling, plasma etching, reactive ion etching, laser ablation and the like, or wet etching using a selective solution of etchant. Then, the photoresist mask is removed by ashing or dissolution with a solvent. For example, the deposition process may be one selected from a group consisting of electron beam evaporation (EBM), chemical vapor deposition (CVD), atomic layer deposition (ALD), and sputtering.

Next, a deep well region 102 is formed in the semiconductor substrate 101 to have a first volume and occupies a first surface region. The deep well region 102 is of the first doping type. For example, the semiconductor substrate 101 is made of silicon. Here, the first doping type is of the doping type opposite to the second doping type. For example, the first doping type is one of an N type and a P type, and the second doping type is the other of the N type and the P type.

For example, the step of forming the deep well region 102 includes forming a photoresist layer on the semiconductor substrate 101. A pattern of the deep well region 102 is formed by a lithographic process to provide openings corresponding to location of the deep well region 102 in the photoresist layer, to form a photoresist mask (not shown). Then, the deep well region 102 is formed by doping the semiconductor substrate 101 with a conventional ion implantation and drive-in diffusion process.

An N-type semiconductor layer or region may be formed by implanting an N-type dopant such as P or As in the semiconductor layer or region. A P-type semiconductor layer or region may be formed by implanting a P-type dopant such as B in the semiconductor layer or region.

By controlling implantation parameters, such as implantation energy and dosage, the dopant may reach a predetermined depth and may have a predetermined doping concentration. By using an additional photoresist mask, lateral extension of the deep well region 102 can be controlled.

Figure 4A:
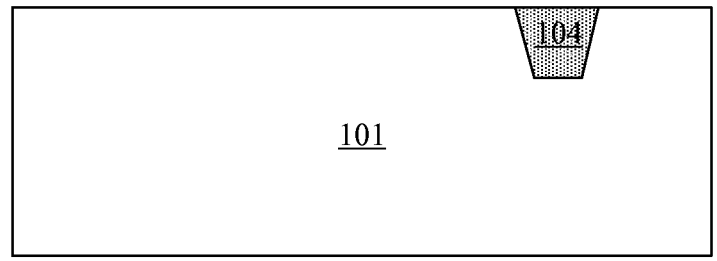
FIGS. 4a to 4j are cross-sectional views illustrating various steps of a method for manufacturing a LDMOS transistor according to an embodiment of the present disclosure.
Figure 4B:
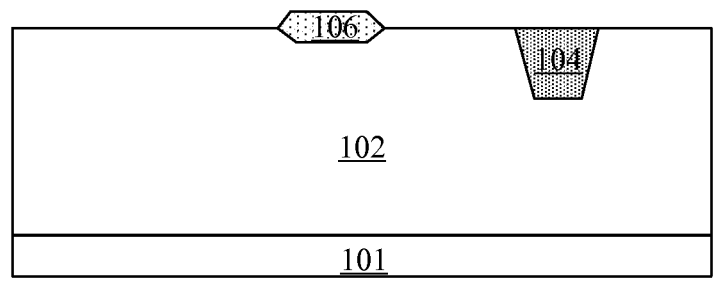

Next, a high-voltage gate oxide 106 is formed by a LOCOS process on a portion of a surface of the active region defined by the shallow trench isolation 104 in the deep well region 102, as shown in FIG. 4b. The high-voltage gate oxide 106 extends below the gate conductor to be adjacent to the drain region. Preferably, the high-voltage gate oxide 106 in this example is an oxide layer.

For example, the LOCOS process includes forming a protection layer of nitride on the surface of the deep well region 102; forming an opening in the protection layer of nitride to expose a portion of the surface of the deep well region 102; performing thermal oxidation to grow an oxide layer on the exposed portion of the surface of the deep well region to form the high-voltage gate oxide 106.

Further, an oxide layer 107 is formed on the surface of the deep well region 102. The oxide layer 107 may be formed by thermal oxidation or the above well-known deposition processes . . . . The gate oxide layer 107 may be made of one selected from a group consisting of oxides, nitrides, oxynitrides, silicates, aluminates, and titanates. Preferably, the oxide layer 107 in this example is an oxide layer. Preferably, the oxide layer 107 in this example has a top surface below that of the high-voltage gate oxide 106. For example, the high-voltage gate oxide 106 has a thickness of about 1000 angstroms, and the oxide layer 107 formed by a thermal oxidation process has a thickness in a range between about 100 angstroms and about 300 angstroms.

Figure 4C:
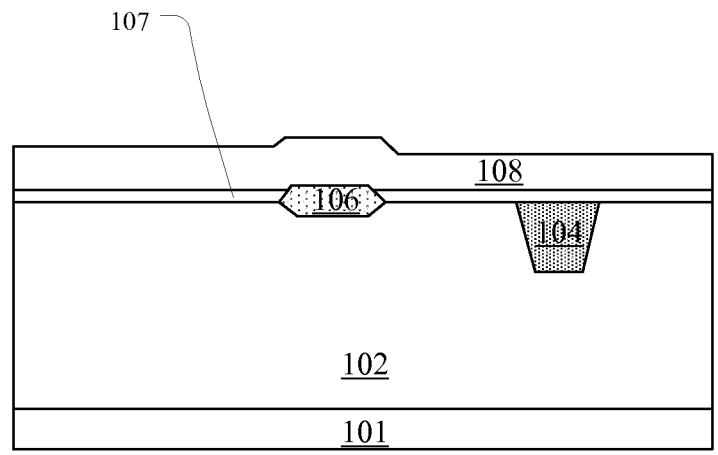

Next, a conductor layer 108 is formed on the surface of the oxide layer 107, as shown in FIG. 4c. The conductor layer 108 may be formed by the above well-known deposition processes. A conductor layer 108 may be made of any conductive material, such as metal, doped polysilicon, and a stack of metal and doped polysilicon, among others. For example, the gate conductor may be made of one selected from a group consisting of TaC, TiN, TaSiN, HfSiN, TiSiN, TiCN, TaAlC, TiAlN, TaN, PtSix, Ni3Si, Pt, Ru, W, and their combinations. Preferably, the conductor layer in this example is a polysilicon layer.

Figure 4D:
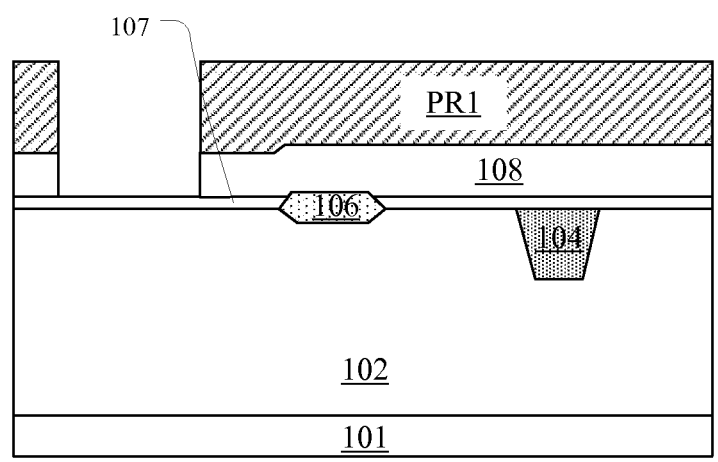

Next, a photoresist mask PR1 is formed on the semiconductor layer. The photoresist mask PR1 defines a pattern of a body region 109. That is, there is an opening corresponding to the body region 109 in the photoresist layer. Then, an exposed portion of the conductor layer 108 is removed by etching from top to bottom through the opening in the photoresist mask. Due to selectivity of the etchant, the etching stops at the surface of the oxide layer 107. However, in an actual process, an exposed surface of the oxide layer 107 may be overetched to ensure that the conductor layer 108 is completely punched through. The etching forms a first side wall of the gate conductor, as shown in FIG. 4d. After etching, the photoresist mask PR1 is still remained.

Figure 4E:
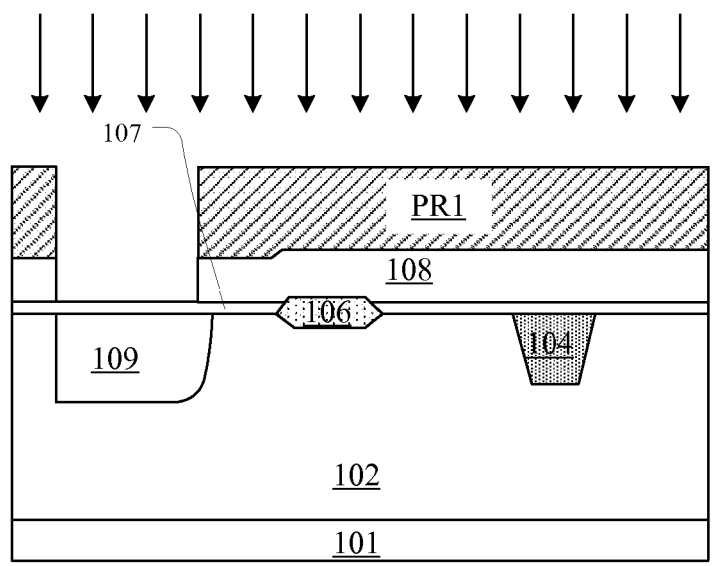

Next, a body region 109 of the second doping type is formed by doping the deep well region 102 with a conventional ion implantation and drive-in diffusion process through the photoresist mask PR1, as shown in FIG. 4e. Then, the photoresist mask PR1 is removed by ashing or dissolution with a solvent.

In the steps shown in FIGS. 4d and 4e, the same one photoresist mask PR1 is used both for etching and ion implantation. Thus, at least a portion of the side wall of the gate conductor is aligned to the body region 109.

More Preferably, after forming the body region 109 of the second doping type, a source link region is formed by doping the body region 109 with a dopant of the first doping type through the photoresist mask PR1.

Next, a photoresist mask PR2 is formed on the semiconductor structure. The photoresist mask PR2 defines a pattern of a gate conductor and shields the body region 109. That is, only a portion of the photoresist layer is remained, corresponding to the gate conductor and the body region 109.

Figure 4F:
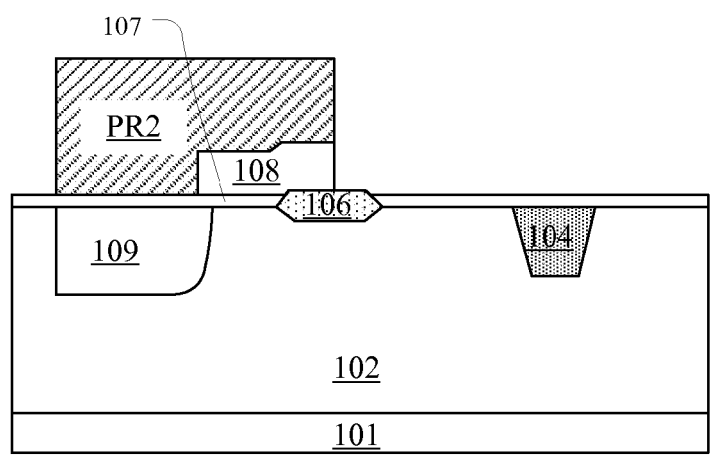

Then, an exposed portion of the conductor layer 108 is removed by etching from top to bottom through the opening in the photoresist mask PR2. Due to selectivity of the etchant, the etching stops at the surface of the oxide layer 107 and the high-voltage gate oxide 106. However, in an actual process, an exposed surface of the oxide layer 107 and the high-voltage gate oxide 106 may be overetched to ensure that the conductor layer 108 is completely punched through. The etching forms a second side wall of the gate conductor, as shown in FIG. 4f. Then, the photoresist mask PR2 is removed by ashing or dissolution with a solvent.

Next, a photoresist mask PR3 is formed on the semiconductor structure. The photoresist mask PR3 defines a pattern of a drift region 110. That is, there is an opening corresponding to the drift region 110 in the photoresist layer.

Figure 4G:
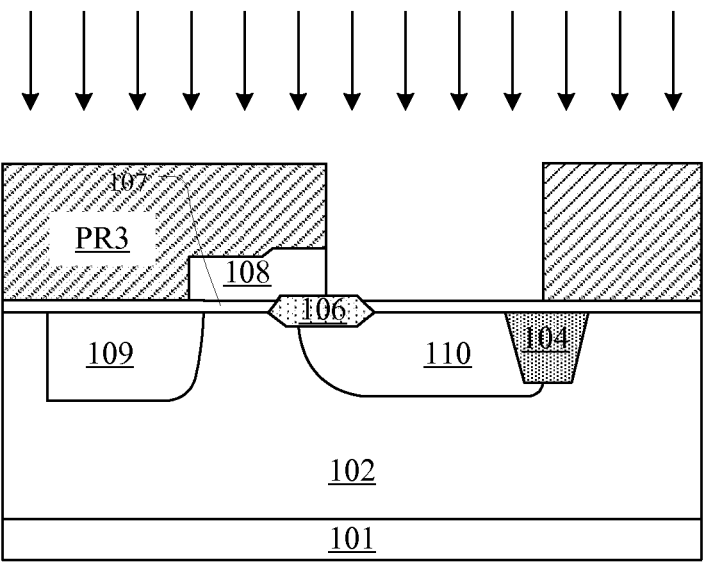

Next, a drift region 110 of the first doping type is formed by doping the deep well region 102 with a conventional ion implantation and drive-in diffusion process through the photoresist mask PR3, as shown in FIG. 4g. Then, the photoresist mask PR3 is removed by ashing or dissolution with a solvent.

Figure 4H:
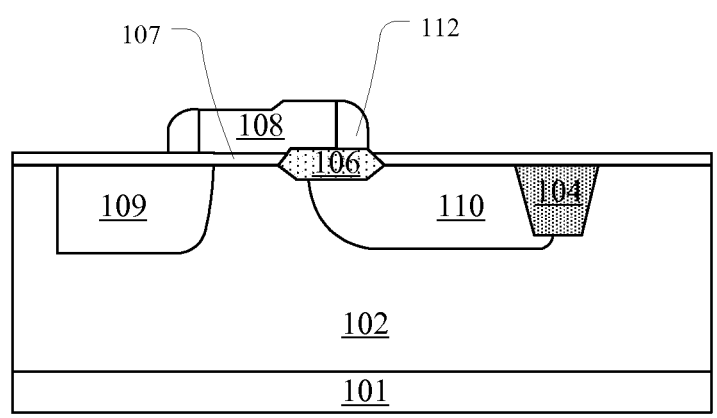

Next, a conformal nitride layer is then formed on the surface of the semiconductor structure by the above conventional deposition process. Lateral portions of the nitride layer are removed by anisotropic etching, for example, reactive ion etching. Consequently, only vertical portions of the nitride layer remain at side walls of the gate conductor 108 to form gate spacers 112, as shown in FIG. 4h. In an example, the gate spacers 112 are silicon nitride layers with a thickness in a range between about 5 nanometers to about 20 nanometers.

Next, a photoresist mask PR4 is formed on the semiconductor structure. The photoresist mask PR4 defines patterns of a source region 115 and a drain region 116. That is, there is openings corresponding to the source region 115 and the drain region 116 in the photoresist layer. Preferably, in this example, the openings also expose the gate conductor 108 and the gate spacers 112.

Figure 4I:
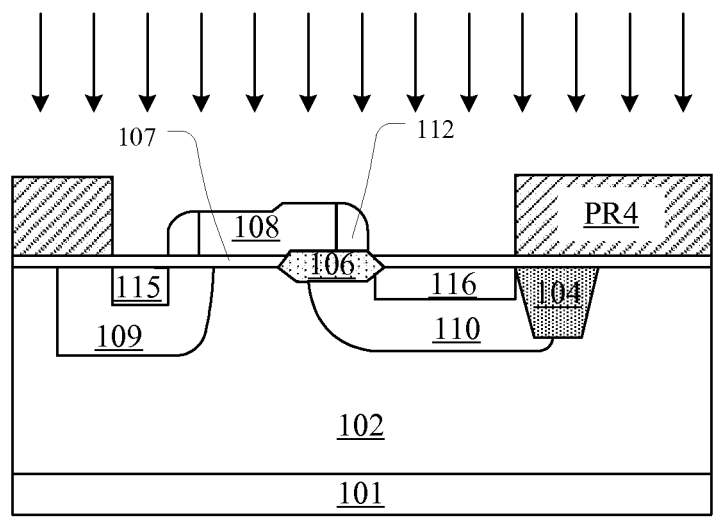

Next, a source region 115 is formed in the body region 109 and a drain region 116 is formed in the drift region 110 by a conventional ion implantation and drive-in diffusion process through the photoresist mask PR4, as shown in FIG. 4i. Then, the photoresist mask PR4 is removed by ashing or dissolution with a solvent.

During ion implantation, if the openings in the photoresist mask PR4 expose the gate conductor 108 and the gate spacers 223, the gate conductor 108 and the gate spacer 112 are used as a hard mask to define the source region 115 and the drain region 116 together with the photoresist mask PR4. The hard mask consisting of the gate conductor 108 and the gate spacers 112 simplifies the design of the photoresist mask PR4 and provides accurate alignment.

At least one of the source region 115 and the drain region 116 may be formed by a double-diffused process. In the double-diffused process, two ion implantations are performed in the same region, followed by a high temperature diffusion process. In an example, the LDMOS transistor is of the N type, the dopant in the first ion implantation is As with a relatively high doping concentration, and the dopant in the second ion implantation is B with a relatively low doping concentration, for formation of the source region 115. In the high-temperature drive-in diffusion process after the two ion implantations, B diffuses further in a horizontal direction than As because the former diffuses rapidly than the latter. Consequently, a doped region with a relatively low concentration extends a distance larger than that a doped region with a relatively high concentration does, to have a lateral concentration gradient. In FIG. 4i, portions of the source region 115 and the drain region 116 extending laterally below the gate conductor 108 are not shown, for the purpose of simplicity.

Next, a photoresist mask PR5 is formed on the semiconductor structure. The photoresist mask PR5 defines a pattern of a body contact region 118. That is, there is an opening corresponding to the body contact region 118 in the photoresist layer.

Figure 4J:
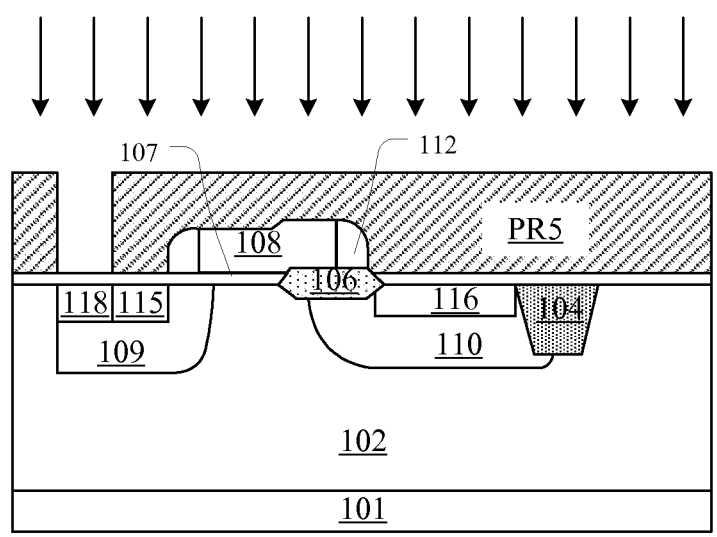

Next, a body contact region 118 is formed in the body region 109 to be adjacent to the source region 115 by a conventional ion implantation and drive-in diffusion process through the photoresist mask PR5, as shown in FIG. 4j. Then, the photoresist mask PR5 is removed by ashing or dissolution with a solvent.

Figure 5A:
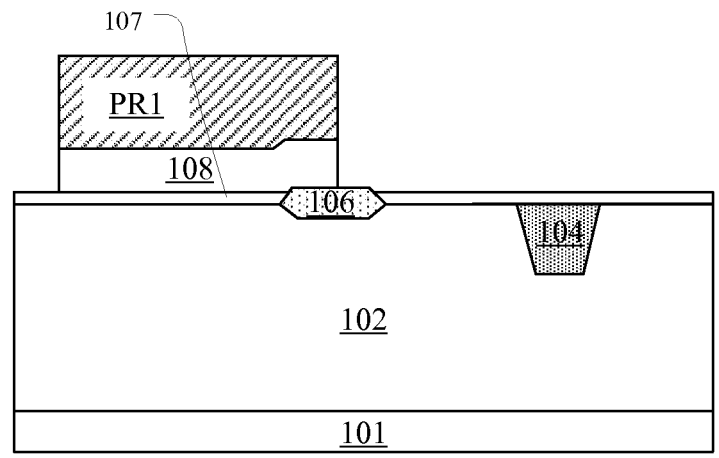
FIGS. 5a to 5c are cross-sectional views illustrating some steps of a method for manufacturing a LDMOS transistor according to another embodiment of the present disclosure.
Figure 5B:
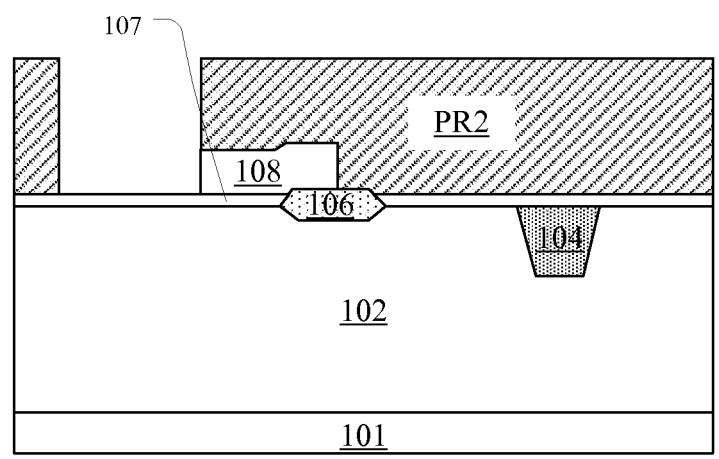
Figure 5C:
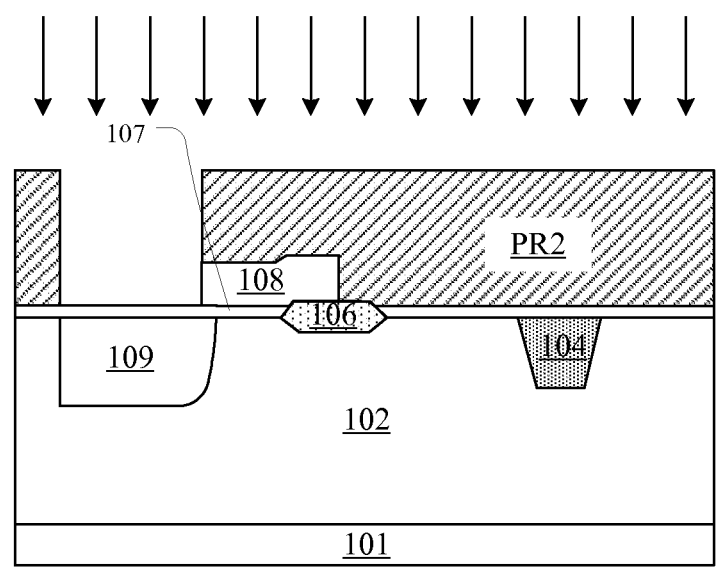

FIGS. 5a to 5c are cross-sectional views illustrating some steps of a method for manufacturing a LDMOS transistor according to another embodiment of the present disclosure. The cross sectional views in FIGS. 5a to 5c are all taken along line AA in FIG. 3a.

In this embodiment, the steps shown in FIGS. 5a to 5c are performed, instead of the steps shown in FIGS. 4d to 4f.

After forming the semiconductor structure shown in FIG. 4c, a photoresist mask PR1 is formed on the semiconductor structure. The photoresist mask PR1 defines a pattern of a gate conductor and shields the body region. That is, only a portion of the photoresist layer is remained, corresponding to the gate conductor and the body region.

Then, an exposed portion of the conductor layer 108 is removed by etching from top to bottom through the opening in the photoresist mask PR1. Due to selectivity of the etchant, the etching stops at the surface of the oxide layer 107. However, in an actual process, an exposed surface of the oxide layer 107 and the high-voltage gate oxide 106 may be overetched to ensure that the conductor layer 108 is completely punched through. The etching forms a first side wall of the gate conductor, i.e. a side wall adjacent to the drain region to be formed, as shown in FIG. 5a. The etching may also expose a portion of the high-voltage gate oxide 106. Then, the photoresist mask PR1 is removed by ashing or dissolution with a solvent.

Next, a photoresist mask PR2 is formed on the semiconductor structure. The photoresist mask PR2 defines a pattern of a body region 109. That is, there is an opening corresponding to the body region 109 in the photoresist layer. Then, an exposed portion of the conductor layer 108 is removed by etching from top to bottom through the opening in the photoresist mask. Due to selectivity of the etchant, the etching stops at the surface of the oxide layer 107. However, in an actual process, an exposed surface of the oxide layer 107 may be overetched to ensure that the conductor layer 108 is completely punched through. The etching forms a second side wall of the gate conductor, which is aligned to the body region 109. After etching, the photoresist mask PR2 is still remained.

Next, a body region 109 of the second doping type is formed by doping the deep well region 102 with a conventional ion implantation and drive-in diffusion process through the photoresist mask PR2, as shown in FIG. 5c. Then, the photoresist mask PR2 is removed by ashing or dissolution with a solvent.

In the steps shown in FIGS. 5b and 5c, the same one photoresist mask PR2 is used both for etching and ion implantation. Thus, at least a portion of the side wall of the gate conductor is aligned to the body region 109.

More Preferably, after forming the body region 109 of the second doping type, a source link region is formed by doping the body region 109 with a dopant of the first doping type through the photoresist mask PR2.

The step shown in FIG. 5c is followed by the steps shown in FIGS. 4g to 4j.

In the methods according to the above embodiments, after forming the source region and the drain region, a portion of the thin gate oxide 107 on the contact region may be removed to expose the contact region in the resultant semiconductor structure. After that, other portions of the LDMOS transistor are then formed from the resultant semiconductor structure, by subsequent steps of forming an interlayer dielectric layer, forming conductive plugs in the interlayer dielectric layer, forming wirings and electrodes on the surface of the interlayer dielectric layer, and the like.

It should be understood that in the methods according to the above embodiments, various doped regions may not be formed in the above sequence. Doped regions of the same doping type may be formed simultaneously. The sequence of various steps in the methods according to the above embodiments is described only illustratively, but not limited thereto. In an alternative embodiment, any transistor and any other semiconductor device may be added if being compatible with the above processes.

In an alternative embodiment, an epitaxy semiconductor layer may be doped, instead of a deep well region 102 in the semiconductor substrate 101, a field oxide may be used, instead of the shallow trench isolation 104, the gate spacers 112 may be omitted, and/or a nitride dielectric or a high-K dielectric may be used, instead of a combination of the thin gate oxide 107 and the high-voltage gate oxide 106.

In an alternative embodiment, a field oxide may be formed between the step of forming the deep well region 102 and the step of forming the high-voltage gate oxide 106, instead of the shallow trench isolation 104 which is formed before formation of the deep well region 102.

In an alternative embodiment, hard masks made of an oxide or a nitride may be used, instead of photoresist masks used in various steps.

In the above description, no details are given for patterning and etching various layers. Nevertheless, one skilled person will appreciate that the layers and regions having desired shapes can be formed by various approaches well known in the field. Moreover, one skilled person may propose a process completely different from the above processes for providing the same structure. Furthermore, although various embodiments are described in different paragraphs, it does not mean that technical approaches in different embodiments cannot be combined advantageously.

Reference has been made in detail to particular embodiments of the disclosure. It should be understood that they have been presented by way of example, and not limitation on the protection scope of the present disclosure. The protection scope is defined by the attached claims and their equivalences. One skilled person will readily recognize that various modifications and changes may be made to the present disclosure, without departing from the true scope of the present disclosure.

What is claimed is:

1. A method for manufacturing a lateral double-diffused metal oxide semiconductor transistor, comprising:
    forming a semiconductor layer of a first doping type;
    forming a high-voltage gate dielectric at a surface of said semiconductor layer;
    forming a thin gate dielectric above said semiconductor layer to have at least a portion adjacent to said high-voltage gate dielectric without using a mask;
    forming a gate conductor above said thin gate dielectric and said high-voltage gate dielectric without using a mask;
    forming a first sidewall of said gate conductor above said thin gate dielectric, by patterning said gate conductor through a first mask;
    forming a second sidewall of said gate conductor at least partially above said high-voltage gate dielectric, by patterning said gate conductor through a second mask; and
    forming source and drain regions of said first doping type, wherein said method further comprises forming a body region of a second doping type opposite to said first doping type by doping through said first mask.

2. The method according to claim 1, said step of forming said second sidewall of said gate conductor is performed before or after said step of forming said first sidewall of said gate conductor.

3. The method according to claim 1, wherein said step of forming said semiconductor of said first doping type comprises forming a deep well region of said first doping type by doping a semiconductor substrate, as said semiconductor layer.

4. The method according to claim 1, wherein said step of forming said semiconductor layer of said first doping type comprises:
    epitaxially growing a semiconductor layer on a semiconductor substrate; and
    doping said semiconductor layer with a dopant of a first type.

5. The method according to claim 1, before said step of forming said semiconductor layer, or between said step of forming said semiconductor layer and said step of forming said high-voltage gate dielectric, further comprising forming shallow trench isolation for defining an active region.

6. The method according to claim 1, between said step of forming said semiconductor layer and said step of forming said high-voltage gate dielectric, further comprising forming a field oxide for defining an active region.

7. The method according to claim 1, wherein said high-voltage gate dielectric is formed by local oxidation of silicon.

8. The method according to claim 1, wherein said high-voltage gate dielectric extends beyond an edge of said gate conductor near said drain region.

9. The method according to claim 1, after said steps of forming said thin gate dielectric, said high-voltage gate dielectric and said gate conductor as a stack, further comprising forming sidewall spacers at said sidewalls of said gate conductor.

10. The method according to claim 1, after said step of forming said source and drain regions, further comprising forming a body contact region of said second doping type and adjacent to said source region.

11. The method according to claim 10, wherein said body contact region is heavily doped compared with said body region.

12. The method according to claim 1, further comprising forming a drift region of said first doping type and adjacent to said high-voltage gate dielectric, wherein said source and drain regions are heavily doped compared with the drift region.

13. The method according to claim 1, wherein each of said thin gate dielectric and said high-voltage gate dielectric is made of at least one selected from a group consisting of oxides, nitrides, and high-K dielectrics.

* * * * *